Nov. 30, 1971 A. I. STOLLER ET AL 3,623,219

METHOD FOR ISOLATING SEMICONDUCTOR DEVICES FROM A WAFER OF SEMICONDUCTING MATERIAL

Filed Oct. 22, 1969 2 Shoots-Shoot 1

INVENTORS
Arthur I. Stoller and
William H. Schilp.
BY
ATTORNEY

INVENTORS
Arthur I. Stoller and
William H. Schilp.
BY Glenn H. Bruestle
ATTORNEY United States Patent Office 3,623,219
Patented Nov. 30, 1971

3,623,219

METHOD FOR ISOLATING SEMICONDUCTOR DEVICES FROM A WAFER OF SEMICONDUCTING MATERIAL

Arthur Irwin Stoller, North Brunswick, and William Henry Schilp, Flemington, N.J., assignors to RCA Corporation Filed Oct. 22, 1969, Ser. No. 868,470
Int. Cl. B01j *17/00;* H01l *5/00*
U.S. Cl. 29—580 8 Claims

ABSTRACT OF THE DISCLOSURE

An array of devices is first formed in a silicon wafer. A protective layer of silicon nitride is deposited on the surface of the wafer, and a glass handle body having a thermal expansion coefficient closely matching that of silicon is sealed to the silicon nitride layer. That portion of the wafer between adjacent devices is etched away, and a body of a softened glass which has a like expansion coefficient, but is less refractory than the glass handle body, is hot-pressed into the array of isolated devices. The handle body is then removed by etching.

BACKGROUND OF THE INVENTION

This invention relates to methods for forming an array of isolated zones of semiconductor material from a wafer of the material, and relates, in particular, to such methods where semiconductor devices are formed in the zones prior to the isolation process.

Several methods have been developed in the semiconductor art for dividing up a wafer of semiconductor material into an array of isolated zone, in order that adjacent devices subsequently formed in the zones are free of parasitic impedances. Some of these methods include actual physical separation of the zones and employ a "handle," or a "support body" which is disposed on the semiconducting wafer to lend structural support to the wafer during the isolation process. After the wafer is processed to separate the zones, the array of isolated zones is then hot-pressed into a softened insulating substrate, such as glass; alternatively, a thin layer of insulating material is deposited over the array of zones and an epitaxial layer of polycrystalline semiconducting material is deposited over the insulating material to impart structural strength. The support body is then removed, and the devices are formed in the isolated zones of the semiconductor material. Examples of these processes are disclosed in Pats. 3,332,137 and 3,391,023.

While methods previously known in the art provide isolation between adjacent devices, these methods suffer several disadvantages. First, the high temperatures required for the handle body disposing step prevents device fabrication until after the isolation process is completed. Thus, normal device fabrication, for example by the planar technique, is not feasible. Further, the high temperatures required during the step of hot-pressing the array of zones into the insulating substrate tends to create unwanted dislocations in the zones. For example in silicon devices, it is known that dislocations begin to occur, and diffusion profiles are adversely affected, when the devices are subjected to processing temperatures above 1100° C. for an appreciable period of time. In addition, in order that the surface of the wafer be completely bonded to the handle body during the isolation process, both the wafer and the body must be extremely flat, and thus, more costly.

Therefore, it would be desirable to employ a low temperature isolation process, so that the devices might be initially formed in the wafer. Further, it would be desirable to employ a slightly deformable material for the handle body to avoid the need for extremely flat surfaces.

SUMMARY OF THE INVENTION

The present invention comprises a method for forming a body of electrically isolated semiconductor devices from a semiconducting wafer having two opposed major surfaces, in which the devices are initially formed adjacent a first one of the surfaces. A protective layer of a substance which is resistant to an etchant for a particular refractory glass, is deposited on the first surface. A handle body of the refractory glass is sealed to the protective layer and portions of the wafer between adjacent devices is removed, so as to provide an array of electrically isolated devices. An insulating body of softened glass which is less refractory than the glass of the handle body is pressed into the isolated array, and between adjacent devices. The handle body is then removed by using an etchant which does not attack the protective layer.

DETAILED DESCRIPTION

A preferred embodiment of the present method will be described with reference to FIGS. 1–8.

Figure 1:
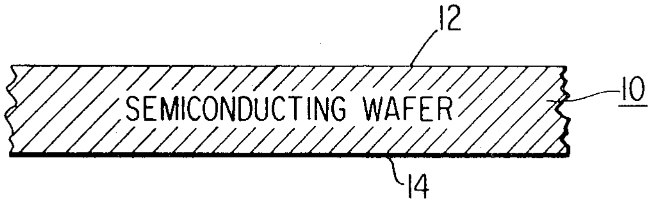
FIGS. 1 to 8 are representative steps in the preferred embodiment of the method of the present invention.
Figure 2:
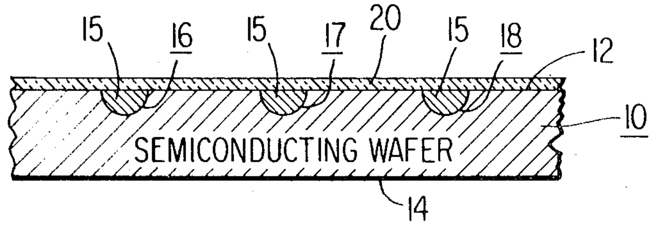

A crystalline semiconductor wafer 10 having two opposed major surfaces 12 and 14, is first provided (FIG. 1). The wafer 10 may be either of P or N type conductivity; however, for purposes of illustration, an N type wafer is described. As shown in FIG. 2, a plurality of discrete semiconductor devices are formed in the wafer 10 through the surface 12 by standard planar techniques well known in the art. The devices may comprise transistors, diodes, resistors, capacitors, or any combination thereof. By way of example, three P-N diodes 16–18 are shown in FIG. 2, each diode comprising a P type region 15 disposed in an adjacent portion of the N type wafer 10, with a P-N junction therebetween. During P region diffusion, an insulating coating 20 is left deposited on the upper surface 12. Alternatively, this coating may be stripped from the surface 12, and a more uniform insulating coating 20 may be deposited on the surface by any one of a variety of techniques known in the art.

Figure 3:
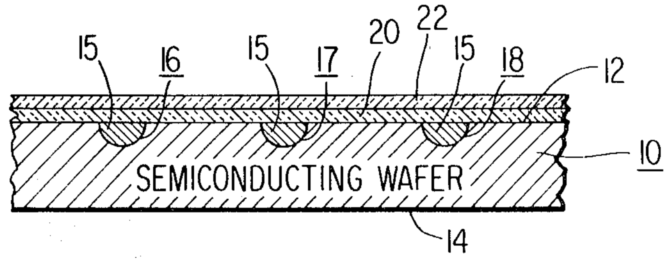
Figure 4:
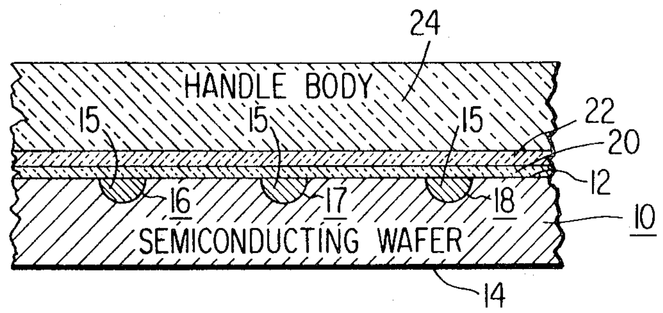

Next, a protective layer 22 of a substance which is resistant to an etchant for a particular refractory glass, is deposited on the insulating coating 20 (FIG. 3). Thereafter, a handle body 24 (FIG. 4) of the particular refractor glass is sealed to the protective layer 22; preferably, the refractory glass has a thermal expansion coefficient closely matching that of the material of the semiconducting wafer 10, and has a softening temperature below 1100° C. The handle body 24 is sealed to the passivating layer 22 by heating the wafer 10 and the glass handle body 24 to a temperature just above the softening point of the glass, and pressing the body 24 and wafer 10 together with a pressure of between 50 and 1000 p.s.i. for about 5 minutes.

Figure 5:
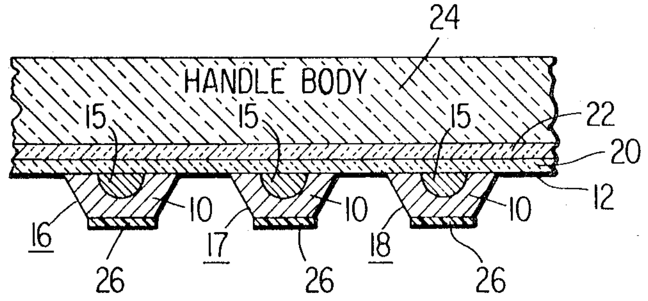

Portions of the wafer 10 between adjacent diodes 16–18 are then removed to provide an array of electrically isolated devices. This is accomplished by first thinning the wafer 10 by abrasion or etching of the second surface 14. An insulating layer is then deposited on the newly formed surface of the thinned wafer 10. The layer is treated with a photoresist, masked corresponding to the desired isolation, and the photoresist is exposed and developed to leave unprotected the surface of the unwanted portions of the insulating layer. The layer is then treated with a suitable etchant, to remove the unprotected portions of the layer, exposing those portions of the thinned surface of the wafer 10 which are to be removed. The wafer 10 is then treated with a suitable etchant, to remove those portions of the wafer 10 between adjacent devices and provide the array of isolated devices 16–18. In FIG. 5, the array of isolated diodes 16–18 is shown with the protected portions of the mask insulating layer (numbered 26) remaining on each device. Optionally, these portions of the layer 26 may then be stripped away.

Figure 6:
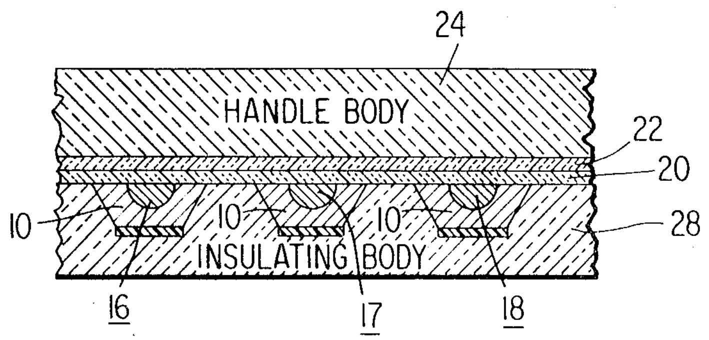
Figure 7:
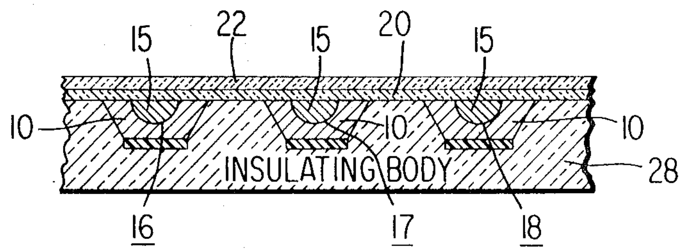

As shown in FIG. 6, an insulating body 28 of a softened glass which is less refractory than the glass of handle body 24, is hot-pressed into the isolated array and between adjacent devices. Preferably, the glass of the insulating body 28 also has a thermal expansion coefficient closely matching that of the material of the wafer 10, portions of which comprise the N type region of the three diodes 16–18 in FIG. 6. The insulating body 28 may be pressed into the isolated array of devices by heating the handle body 24, devices 16–18, and the insulating body 28 to a temperature above the softening point of the glass of the insulating body, and hot-pressing the body 28 into the array at a pressure between 50 and 1000 p.s.i. for about 5 minutes.

Thereafter, the handle body 24 is removed (FIG. 7) using an etchant which does not attack the protective layer 22. During the handle body removal step, the exposed surface and sides of the insulating body 28 are covered with a suitable protective material.

Figure 8:
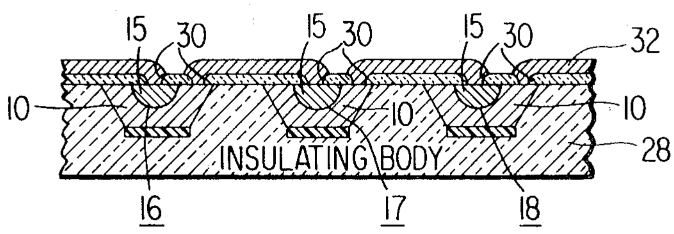

As illustrated in FIG. 8, the protective layer 22 is then removed by etching. The underlying insulating coating 20 is then treated with a photoresist-etch sequence to define contact apertures 30, exposing portions of the semiconducting regions 10 and 15 of the devices 16–18 at the surface 12. A metal contact layer is then deposited on the remaining insulating coating 20 and through the contact apertures. The desired contact pattern is then defined, using a final photoresist-etch sequence. By way of illustration, contact structure 32 of FIG. 9 bridges the coating 20 and makes contact through the apertures to interconnect the diodes 16–18 in series.

Alternatively, the protective layer 22 may be treated with a photoresist-etch sequence to define the contact apertures through the protective layer 22 and the insulating coating 20; the remaining portions of the protective layer 22 thus serve as further protection from the ambient.

EXAMPLE

A specific example of the present method, as employed to produce an isolated array of diodes for use as an image sensor, will now be described. The starting material was an N type monocrystalline silicon wafer having a rectangular grid of P-N diodes diffused into the wafer, with the diodes spaced 4.0 mils apart in both directions. The dimensions of the wafer are not critical; by way of example, a wafer 1.5 inches in diameter and 6.0 mils thick is suitable. During device diffusion, a thin layer of silicon dioxde was deposted on the surface of the wafer.

Next, a protective layer of silicon nitride about 1000 A. thick, was deposited on the silicon dioxide layer by the pyrolytic decomposition from the reaction of silane ($SiH_4$) and ammonia ($NH_3$). Silicon nitride serves as a good protective layer, since it resists hydrofluoric acid, whch is an excellent etchant for most refractory glasses.

Thereafter, a handle body of Corning #1715 glass was sealed to the silicon nitride protective layer. This glass softens at a temperature of about 1060° C., has a thermal expansion coefficient of about $35\times10^{-7}$ cm./cm./ ° C., which closely matches that of silicon, and consists essentially of the following, by weight: silicon dioxide ($SiO_2$), 63.7%; aluminum oxide ($Al_2O_3$), 25.0%; and calcium oxide (CaO), 11.3%. The thickness of the glass handle body is not critical; for instance, a body which is 25.0 mils thick is suitable. The Corning #1715 glass was sealed to the silicon nitride layer by hot-pressing in a vacuum at 1080° C. using 500 p.s.i. of pressure for 5 minutes. The glass and the wafer were then cooled to 860° C., at which temperature the body and the wafer were annealed with no pressure applied.

The #1715 glass was then lapped to make its exposed surface parallel to that of the wafer's surface, and the lower surface of the wafer was polished to a thickness of 1.0 mil, using a Lustrox polishing technique. A 1.0 micron layer of silicon dioxide was deposited on the polished lower surface of the wafer by the pyrolytic decomposition of silane in oxygen at 450° C. The $SiO_2$ layer was then densified by heating in air to 800° C. for 10 minutes. Using a photoresist technique, the $SiO_2$ layer was etched with buffered hydrofluoric acid, to define in the layer a pattern of bars 2.0 mils wide on 4.0 mils centers. The pattern was registered so that a row of diodes was included in each bar; the bar pattern was then defined by etching the wafer in a boiling solution of 25.0 grams of potassium hydroxide (KOH) in 100 cc. of water for about 5 minutes. Since this particular etchant is crystallographically selective, it was necessary that the rows of the P–N diodes in the wafer be aligned parallel to the intersections of the (111) planes with the (100) surface of the wafer. An insulating body of Corning #7070 glass was then hot-pressed into the array of silicon diodes, filling the regions between adjacent diodes. This glass softens at a temperature of about 715° C., has a thermal expansion coefficient of about $32\times10^{-7}$ cm./cm.° C., which closely matches that of silicon, and consists essentially of the following by weight: silicon dioxide ($SiO_2$), 70.0%; aluminum oxide ($Al_2O_3$), 1.1%; Potassium dioxide ($K_2O$), 0.5%; boron oxide ($B_2O_3$), 28.1%; and lithium oxide ($Li_2O$), 1.2%. The thickness of the insulating body is not critical; suitably, it is also about 25.0 mils thick. The hot-pressing step was done at 710° C. for about 10 minutes using 500 p.s.i. of pressure, and annealing at 500° C. for 15 minutes with no pressure applied.

The #1715 glass, which served as a temporary handle during the isolation process, was then removed by lapping the glass to about 3.0 mils thickness and dissolving the remainder in a 49% hydrofluoric acid solution; during this step, the #7070 glass was protected by being waxed with paraffin to an alumina disc. The silicon nitride layer was then removed by etching in hot phosphoric acid. The contact apertures were defined in the oxide layer by using a photoresist sequence and a buffered hydrofluoric acid etch.

Figure 9:
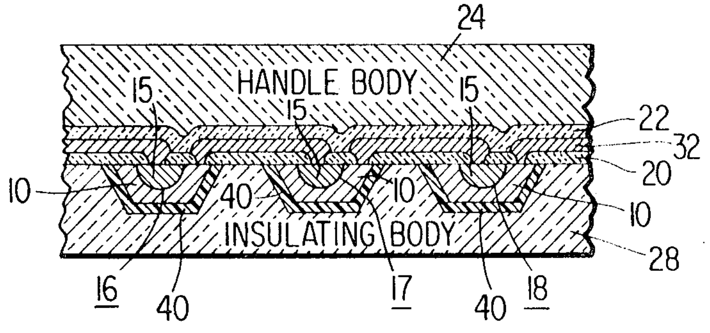
FIG. 9 illustrates alternative steps in the method of the present invention.

An alternate embodiment of the present method will be described with reference to FIG. 9. The method is essentially the same as that described above, except that, alternatively, a refractory metal structure 32 is deposited and defined on the insulating coating 20, before deposition of the protective layer 22. Suitable refractory metals include tungsten and molybdenum; however, tungsten is preferred.

Another alternative step in the basic process comprises depositing a thin metal layer 40 (FIG. 9) on each N type region 10 of the isolated diodes 16–18, after the step of removing portions of the wafer, and before the step of pressing the array into the insulating body 28. Preferably, the metal layer 40 comprises nickel deposited by an electroless process. The nickel layer serves to reduce the equivalent resistance of the semiconducting region upon which it is deposited.

The isolation process of the present invention offers many advantages. First, the maximum temperature used in the process does not exceed 1100° C., and thus, does not cause a substantial change in device diffusion profiles, allowing isolation to be carried out after the devices are fabricated by normal planar techniques. Further, the lower temperatures and pressures used in either hot-pressing step minimizes the introduction of dislocations in the semiconducting wafer. In addition, the use of a glass handle body, as described, eliminates the need for extremely flat semiconducting wafers and handle bodies.

What is claimed is:

1. A method for forming a body of electrically isolated semiconductor devices from a semiconducting wafer in which the devices are initially formed, comprising the steps of:

providing a crystalline semiconducting wafer having two opposed major surfaces;

forming a plurality of semiconductor devices in the wafer adjacent a first one of the surfaces;

depositing a protective layer of silicon nitride on the first surface;

sealing a handle body of a refractory glass to the protective layer;

removing portions of the wafer between adjacent devices so as to provide an array of electrically isolated devices;

pressing an insulating body of softened glass which is less refractory than the glass of the handle body, into the array of devices and between adjacent devices; and dissolving the handle body using a chemical etchant which does not attack the protective layer.

2. A method in accordance with claim 1, including the additional step of:

disposing a refractory metal contact pattern on the upper surface of the wafer after the device forming step; and depositing the protective layer onto the first surface and the contact pattern.

3. A method in accordance with claim 1, wherein the etchant consists of hydrofluoric acid.

4. A method in accordance with claim 1, wherein the glass handle body and the glass insulating body have a coefficient of thermal expansion closely matching that of the semiconducting wafer.

5. A method in accordance with claim 4, wherein the glass of the handle body has a softening temperature below 1100° C.

6. A method in accordance with claim 1, wherein the handle body sealing step comprises:

heating the handle body to a temperature above the softening point of the refractory glass; and pressing the handle body and the wafer together with a pressure sufficient to seal the handle body to the protective layer.

7. A method in accordance with claim 1, including the additional step of depositing a metal layer on each isolated device, after the step of removing portions of the wafer.

8. A method in accordance with claim 1, including the additional step of depositing a protective material on the insulating body after the insulating body pressing step.

References Cited

UNITED STATES PATENTS

| | | | |
|---|---|---|---|
| 3,343,255 | 9/1967 | Donovan | 29—576 IW UX |
| 3,381,182 | 4/1968 | Thornton | 29—576 IW UX |
| 3,370,204 | 2/1968 | Cave | 29—576 IW UX |
| 3,341,743 | 9/1967 | Ramsey | 29—576 IW UX |

JOHN F. CAMPBELL, Primary Examiner

W. TUPMAN, Assistant Exominer

U.S. Cl. X.R.

156—17